United States Patent
Yamane et al.

(10) Patent No.: US 10,698,311 B2
(45) Date of Patent: Jun. 30, 2020

(54) REFLECTION-TYPE EXPOSURE MASK

(71) Applicant: Toshiba Memory Corporation, Tokyo (JP)

(72) Inventors: Takeshi Yamane, Tsukuba Ibaragi (JP); Kosuke Takai, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/693,284

(22) Filed: Aug. 31, 2017

(65) Prior Publication Data

US 2018/0275506 A1   Sep. 27, 2018

(30) Foreign Application Priority Data

Mar. 22, 2017 (JP) .................. 2017-056399

(51) Int. Cl.
*G03F 1/24* (2012.01)
*G03F 7/20* (2006.01)
*G03F 1/26* (2012.01)
*G03F 1/72* (2012.01)

(52) U.S. Cl.
CPC .............. *G03F 1/24* (2013.01); *G03F 1/26* (2013.01); *G03F 1/72* (2013.01); *G03F 7/702* (2013.01)

(58) Field of Classification Search
CPC ... G03F 1/24; G03F 7/702; G03F 1/26; G03F 1/72
See application file for complete search history.

(56) References Cited

U.S. PATENT DOCUMENTS

| 6,872,497 | B1  |   | 3/2005  | Levinson et al. |            |
|-----------|-----|---|---------|-----------------|------------|
| 10,018,904 | B2 | * | 7/2018  | Takai           | G03F 1/22  |
| 2002/0192571 | A1 |  | 12/2002 | Schwarzl        |            |
| 2004/0131947 | A1 | * | 7/2004 | Fisch Gallagher | B82Y 10/00 430/5 |
| 2005/0112510 | A1 | * | 5/2005 | Bakker          | G03F 7/70575 430/396 |
| 2005/0238963 | A1 | * | 10/2005 | Ishibashi      | B82Y 10/00 430/5 |

FOREIGN PATENT DOCUMENTS

| JP | H06120125 A | 4/1994 |
| JP | 2005340553 A | 12/2005 |
| JP | 2013197481 A | 9/2013 |
| JP | 2015008283 A | 1/2015 |

(Continued)

OTHER PUBLICATIONS

Machine translation of JP 2016-009744 A.*

(Continued)

*Primary Examiner* — Deoram Persaud
(74) *Attorney, Agent, or Firm* — Kim & Stewart LLP (57) ABSTRACT

A reflection-type exposure mask includes a light reflector provided in a pattern on a substrate. The light reflector has a multilayer structure including first-type layers and second-type layers that are alternately stacked. The second-type layers have a refractive index higher at an extreme ultraviolet wavelength than a refractive index of the first-type layer at the extreme ultraviolet wavelength. A light transmitting medium is on a side surface of the light reflector.

21 Claims, 9 Drawing Sheets

(56) References Cited

FOREIGN PATENT DOCUMENTS

| | | |
|---|---|---|
| JP | 2015035529 A | 2/2015 |
| JP | 2015125166 A | 7/2015 |
| JP | 2015141972 A | 8/2015 |
| JP | 2016009744 A | 1/2016 |
| JP | 5970901 B2 | 8/2016 |
| KR | 101285975 B1 | 7/2013 |

OTHER PUBLICATIONS

Machine translation of JP 2015-141972 A.*
Japanese Office Action dated Dec. 25, 2019, mailed in counterpart Japanese Application No. 2017-056399, 4 pages (with translation).

* cited by examiner

REFLECTION-TYPE EXPOSURE MASK

CROSS-REFERENCE TO RELATED APPLICATION

This application is based upon and claims the benefit of priority from Japanese Patent Application No. 2017-056399, filed Mar. 22, 2017, the entire contents of which are incorporated herein by reference.

FIELD

Embodiments described herein relate generally to a reflection-type exposure mask.

BACKGROUND

A reflection-type exposure mask is used in photolithography using extreme ultraviolet (EUV) light. The reflection-type exposure mask for EUV lithography typically has a multilayer film provided on a substrate so as to selectively reflect the EUV light. For EUV exposure, the reflection-type exposure mask is irradiated and the reflected light is then ultimately focused onto a photoresist film on a wafer substrate to transfer a predetermined pattern of unexposed and exposed regions to the photoresist film. To improve the fidelity of the transferred pattern to the mask pattern, improved contrast in the optical image formed in the resist film would be desirable.

DETAILED DESCRIPTION

An example embodiment provides a reflection-type exposure mask providing improved contrast in an optical image.

In general, according to one embodiment, a reflection-type exposure mask includes a light reflector provided in a pattern on a substrate. The light reflector has a multilayer structure including first-type layers and second-type layers that are alternately stacked. The second-type layers have a refractive index that is higher at an extreme ultraviolet wavelength than a refractive index of the first-type layer at the extreme ultraviolet wavelength. A light transmitting medium is disposed on a side surface of the light reflector.

Hereinafter, example embodiments will be described with reference to the drawings. The drawings are schematic or conceptual. In the drawings, the depicted relationship between the thickness and the width of each part, the ratio of the sizes between parts, and the like are not necessarily those of actual parts. Likewise the same part (s) maybe illustrated in different drawings with different dimensions or a different relative dimensions for purposes of explanation of different aspects.

First Embodiment

Figure 1A:
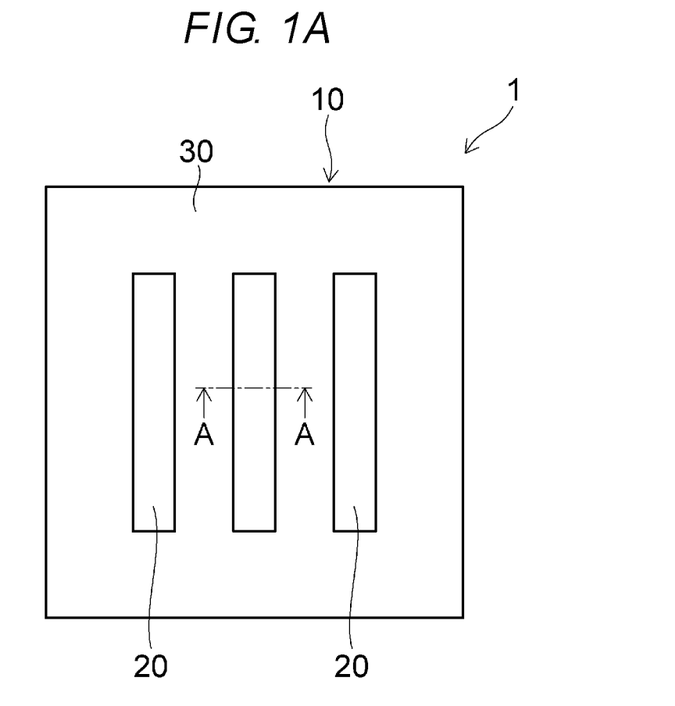
FIGS. 1A and 1B are schematic diagrams illustrating aspects of a reflection-type exposure mask according to a first embodiment.
Figure 1B:
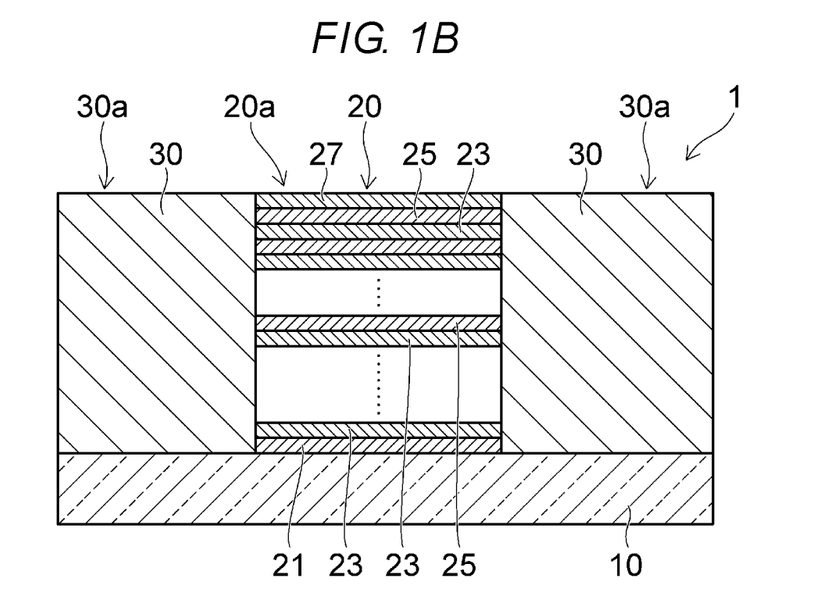

FIG. 1 is a schematic diagram illustrating a reflection-type exposure mask 1 according to a first embodiment. FIG. 1A is a top view of the reflection-type exposure mask 1 and FIG. 1B is a cross-sectional view taken along line A-A in FIG. 1A.

The reflection-type exposure mask 1 includes a substrate 10, a light reflector 20, and a light transmission medium 30. The substrate 10 is a glass substrate, for example. The light reflector 20 is selectively provided on the substrate 10 in a pattern corresponding to an intended pattern for transfer to a wafer substrate or the like. The light transmission medium 30 is provided around the light reflector 20 and covers the side surface of the light reflector 20.

As illustrated in FIG. 1A, the reflection-type exposure mask 1 includes a plurality of light reflectors 20, for example. The light transmission medium 30 is provided to cover the front surface of the substrate 10 between and around the light reflectors 20.

As illustrated in FIG. 1B, the light reflector 20 has a multilayer structure in which a buffer layer 21, a first refractive-index layer 23, a second refractive-index layer 25, and a capping layer 27 are provided. The buffer layer 21 is provided adjacent to the substrate 10. The first refractive-index layer 23 and the second refractive-index layer 25 are alternately stacked on the buffer layer 21. The capping layer 27 is provided as the top layer of the multilayer structure.

The buffer layer 21 is, for example, a silicon layer and is formed to be thicker than the first refractive-index layer 23 and the second refractive-index layer 25. The first refractive-index layer 23 is, for example, a molybdenum layer and is formed on the buffer layer 21. The second refractive-index layer 25 is, for example, a silicon layer and is provided on the first refractive-index layer 23.

The light reflector 20 includes many pairs of first refractive-index layers 23 and second refractive-index layers 25 stacked in alternating fashion. The first refractive-index layer 23 has, for example, a refractive index smaller than the refractive index of the second refractive-index layer 25. The light reflector 20 includes, for example, a ruthenium layer as the capping layer 27. The ruthenium layer has a thickness of 2.5 nm.

The light transmission medium 30 includes, for example, zirconium. The light transmission medium 30 has an attenuation coefficient which is smaller than those of tantalum nitride (TaN) and tantalum boron nitride (TaBN) used as an absorbing medium for EUV light, for example. The attenuation coefficient of TaN is 0.0436 and the attenuation coefficient of TaBN is 0.0437. The light transmission medium 30 has an attenuation coefficient of 0.043 or smaller, for example.

The light transmission medium 30 is formed by depositing, for example, a zirconium layer on the substrate 10. For example, the light transmission medium 30 is formed in a manner that a zirconium layer which is initially thicker than the height of the light reflector 20 is deposited, and then the zirconium layer is etched back or polished so as to expose the upper surface 20a of the light reflector 20. As illustrated in FIG. 1B, the upper surface 30a of the light transmission medium 30 is positioned at a level which is substantially the same as that of the upper surface 20a of the light reflector 20. That is, the upper surface 30a of the light transmission medium 30 is formed to have a height which is substantially the same as the height of the upper surface 20a of the light reflector 20.

Figure 2A:
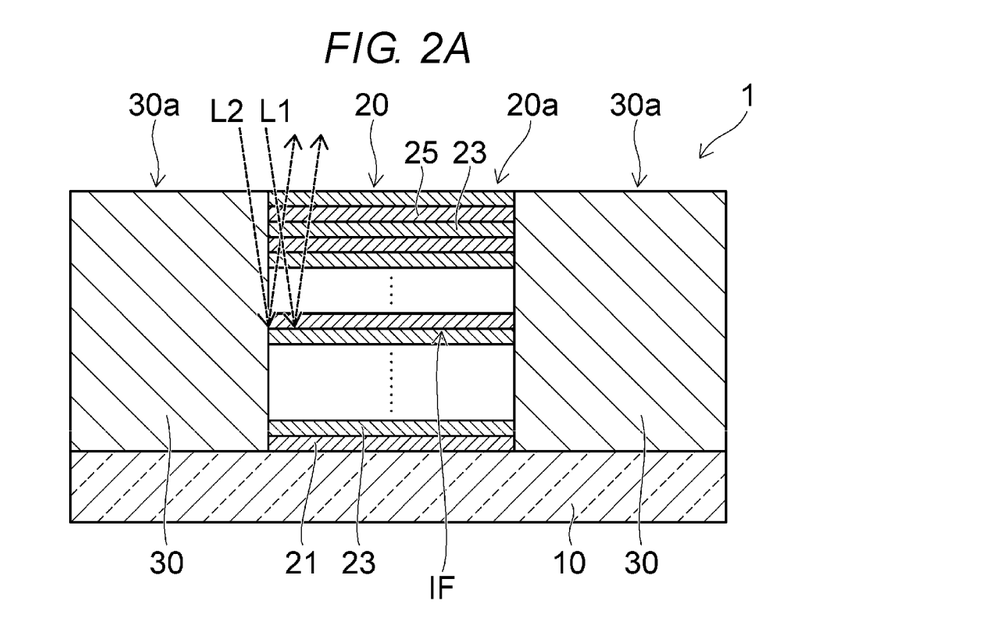
FIGS. 2A and 2B are cross-sectional views schematically illustrating the reflection-type exposure mask according to the first embodiment and a reflection-type exposure mask according to a comparative example, respectively.
Figure 2B:
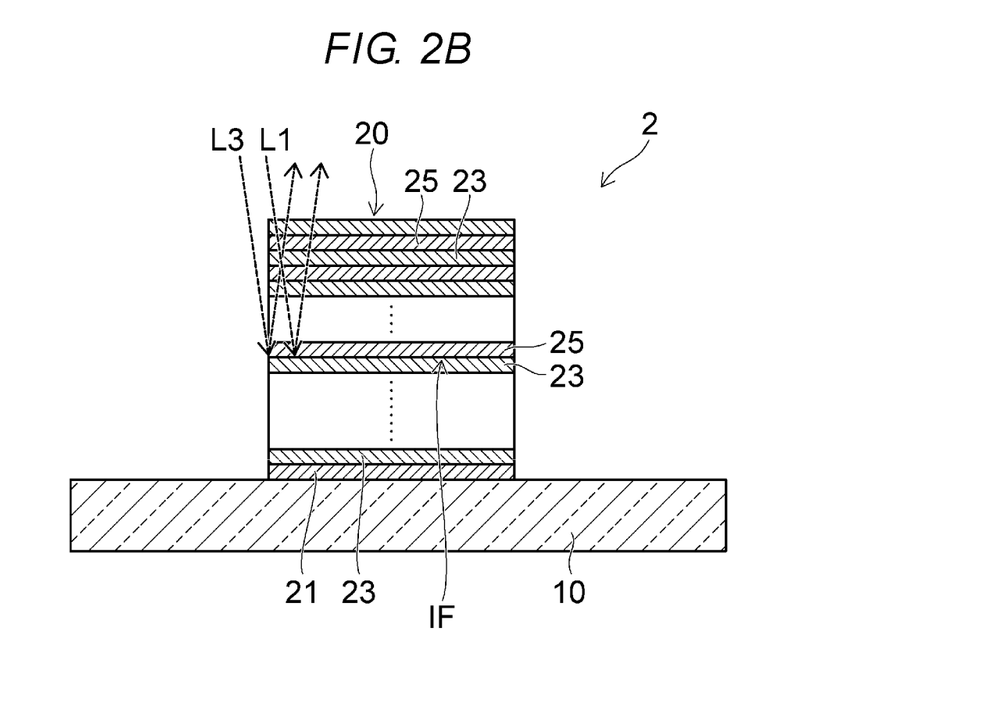
Figure 3A:
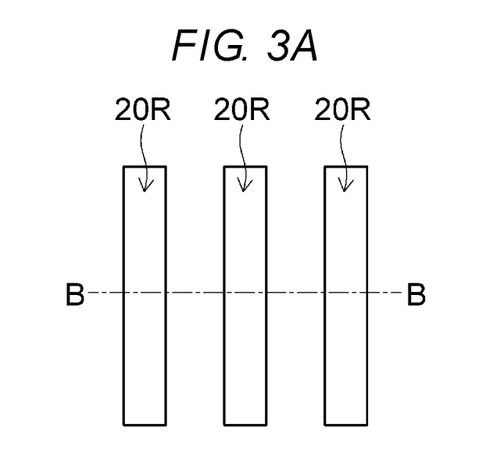
FIGS. 3A and 3B are schematic diagrams illustrating characteristics of the reflection-type exposure mask according to the first embodiment.
Figure 3B:
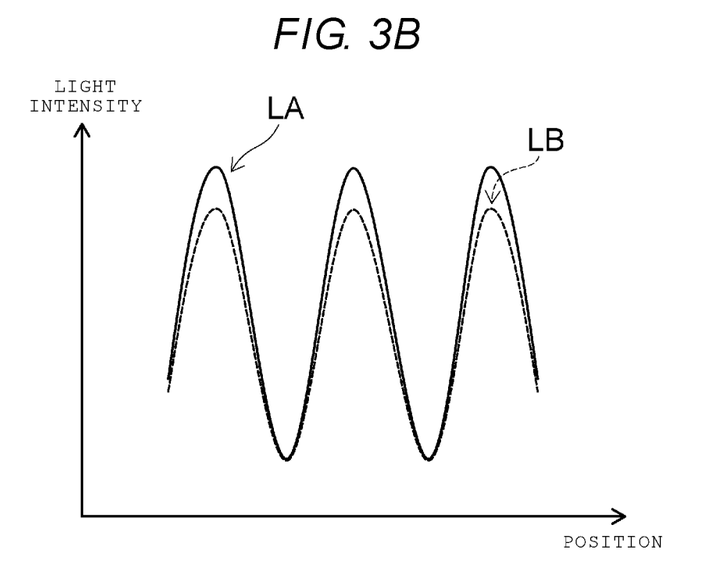

Next, characteristics of the reflection-type exposure mask 1 according to the first embodiment will be described with reference to FIGS. 2A to 3B. FIGS. 2A and 2B are cross-sectional views schematically illustrating the reflection-type exposure mask 1 and a reflection-type exposure mask 2 according to a comparative example, respectively. FIGS. 3A and 3B are schematic diagram illustrating characteristics of the reflection-type exposure masks 1 and 2.

FIG. 2A is a cross-sectional view illustrating the reflection-type exposure mask 1 and FIG. 2B is a cross-sectional view illustrating the reflection-type exposure mask 2. As illustrated in FIG. 2B, the light transmission medium 30 is not provided in the reflection-type exposure mask 2. L1, L2, and L3 illustrated in FIGS. 2A and 2B indicate rays of exposure light. The rays L1, L2, and L3 of exposure light are parallel rays. The reflection-type exposure masks 1 and 2 are irradiated with the rays L1, L2, and L3 of exposure light at a predetermined angle of incidence, for example, 6 degrees from normal.

In the reflection-type exposure mask 1 illustrated in FIG. 2A, the exposure light L1 is incident from the upper surface 20a of the light reflector 20, and then is reflected by an interface IF between the first refractive-index layer 23 and the second refractive-index layer 25. Then, the light L1 is emitted upwardly from the upper surface 20a of the light reflector 20. The exposure light L2 is incident from the upper surface 30a of the light transmission medium 30 and propagates in the light transmission medium 30, and then is reflected by the interface IF. The exposure light L2 propagates upward in the light reflector 20 and is emitted from the upper surface 20a of the light reflector 20.

Also in the reflection-type exposure mask 2 illustrated in FIG. 2B, the exposure light L1 propagates in the light reflector 20 and is reflected by the interface IF. Then, the exposure light L1 propagates upward and is emitted from the upper surface of the light reflector 20. After the exposure light L3 propagates in an exposure atmosphere, the exposure light L3 is reflected by the interface IF. Then, the exposure light L3 propagates upward in the light reflector 20 and is emitted from the upper surface 20a of the light reflector 20.

For example, the thickness of the first refractive-index layer 23, which is a molybdenum layer in this example, is set to 2.8 nanometers (nm) and the thickness of the second refractive-index layer 25, which is a silicon layer in this example, is set to 4.2 nm. It is assumed that the light reflector 20 includes 40 pairs of first refractive-index layers 23 and second refractive-index layers 25.

About 90% of EUV light which penetrates the light reflector 20 reaches the interface IF positioned at a depth from the upper surface 20a corresponding to 20 pairs. Then, the light is reflected upwardly. That is, most of rays of EUV light penetrate to half of the height of the light reflector 20.

The refractive index of the EUV light is 0.999 in silicon and 0.921 in molybdenum. If the refractive index of vacuum is set to 1.000, a phase difference between the light L1 which penetrates to a depth of half of the light reflector 20 to be reflected at the interface IF and the exposure light L3 which is reflected by at same interface IF is, for example, approximately $\pi/2$ radians.

Conversely, the phase difference between the exposure light L2, which propagates in the light transmission medium 30 having a refractive index lower than that of vacuum, reflected at the interface IF, and the exposure light L1 is less than $\pi/2$. For example, when zirconium is used as the material of the light transmission medium 30, the phase of the exposure light L1 still substantially coincides with the phase of the exposure light L2.

FIG. 3A is a schematic diagram illustrating an optical image 20R formed on a wafer by EUV light which is reflected by the light reflectors 20. FIG. 3B is a schematic diagram illustrating intensity of the EUV light taken along ling B-B illustrated in FIG. 3A. Light intensity distributions LA and LB illustrated in FIG. 3B indicates light intensity distribution of an optical image formed by EUV light reflected by the reflection-type exposure masks 1 and 2, respectively.

The light intensity distribution LA indicates light intensity distribution of an optical image formed by the reflection-type exposure mask 1. The light intensity distribution LB indicates light intensity distribution of an optical image formed by the reflection-type exposure mask 2. As illustrated in FIG. 3B, a peak value of light intensity in the light intensity distribution LA is higher than a peak value thereof in the light intensity distribution LB. That is, in the reflection-type exposure mask 1, the phases of the exposure light L1 and L2 coincide with each other and intensity of the reflected light is strengthened by interference. Therefore, light intensity of the optical image on the wafer is higher. Meanwhile, in the reflection-type exposure mask 2, the phase of the exposure light L1 is different from the phase of the exposure light L3, and intensity of the reflected light is decreased by interference. As a result, the light intensity of the optical image is lower than that of the optical image obtained by the reflection-type exposure mask 1.

In the reflection-type exposure mask 1, it is possible to reduce the phase difference between the exposure light L1 and exposure light which is incident on the light reflector 20, and then is reflected at the interface IF to propagate upward in the light transmission medium 30. This result is not limited to exposure light which penetrates the light reflector 20 up to the deepest position. Interference between rays of exposure light which are respectively reflected at the plurality of interfaces IF also contributes to this result. Therefore, the contrast of the optical image formed on the wafer by the reflection-type exposure mask 1 is higher than the contrast of the reflection-type exposure mask 2.

As described above, it is possible to improve intensity of reflected light and to improve contrast of an optical image formed on a wafer by providing the light transmission medium 30 in a reflection-type exposure mask 1. The material used for the light transmission medium 30 is not limited to zirconium and any material may be used so long as the material causes the phase difference between the rays of exposure light L1 and L2 to be reduced. For example, carbon, boron carbide, or the like may be used for the light transmission medium 30. In general, it is preferable that the refractive index of the light transmission medium 30 has a value that is between the refractive index of the first refractive-index layer 23 and the refractive index of the second refractive-index layer 25.

Figure 4A:
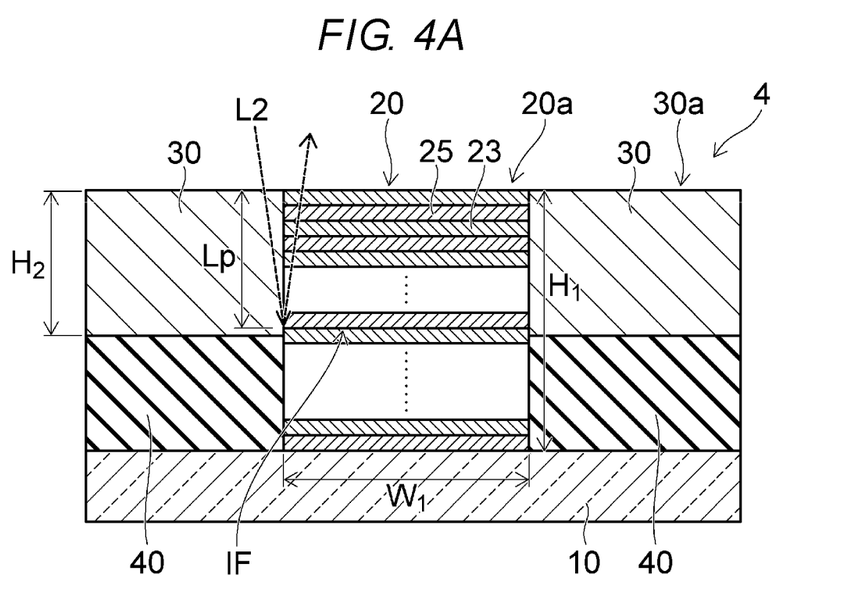
FIGS. 4A and 4B are cross-sectional views schematically illustrating reflection-type exposure masks according to modification examples of the first embodiment.
Figure 4B:
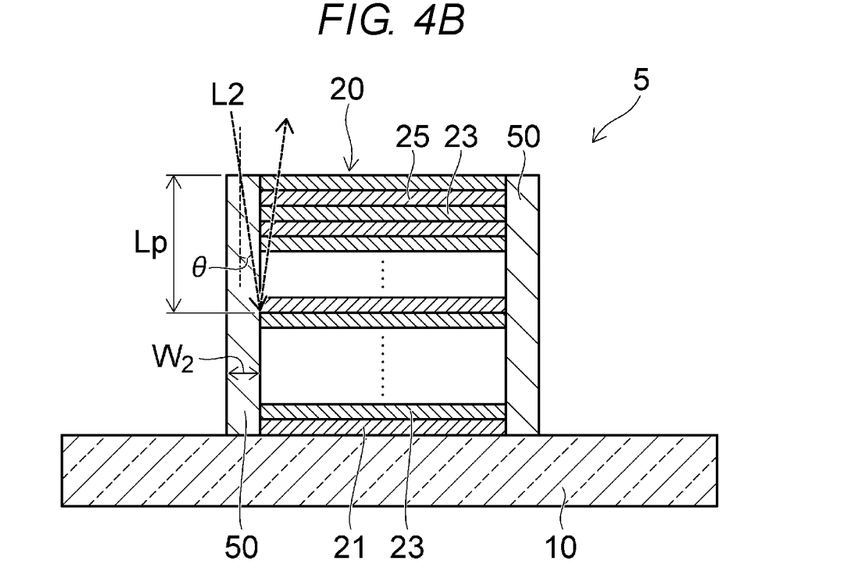

FIGS. 4A and 4B are cross-sectional views schematically illustrating reflection-type exposure masks 4 and 5 according to modification examples of the first embodiment.

The reflection-type exposure mask 4 illustrated in FIG. 4A further includes an intermediate layer 40 provided between the substrate 10 and the light transmission medium 30. The intermediate layer 40 is, for example, a silicon oxide layer. In a process of forming the intermediate layer 40, for example, a silicon oxide layer having a thickness which is greater than the height H1 of the light reflector 20 is formed so as to cover the surfaces of the light reflector 20 and the substrate 10. After the upper surface is polished flat, the silicon oxide layer is then selectively etched back.

For example, if a fine reflection pattern is provided on the reflection-type exposure mask and an aspect ratio (height H1/width W1) of the light reflector 20 is large, the light reflector 20 may be broken in a process of manufacturing the reflection-type exposure mask. Thus, in the reflection-type exposure mask 4, in order to prevent collapse or breakage of the light reflector 20, the intermediate layer 40 covering the lower portion of the light reflector 20 is provided.

The light transmission medium 30 is then provided on the intermediate layer 40 with the upper surface 30a of the light transmission medium 30 having a height which is at the same level as the upper surface 20a of the light reflector 20. The light transmission medium 30 is a height H2 from the upper surface of the intermediate layer 40. It is preferable that the height H2 of the light transmission medium 30 is greater than a penetration length Lp of EUV light into the light reflector 20, for example. The penetration length Lp indicates the half of inverse calculation of an equivalent absorption coefficient of the light reflector 20. When the number of pairs of first refractive-index layers 23 and second refractive-index layers 25 is set to 40, the light transmission medium 30 height H2 is, for example, equal to a half of the height H1 of the light reflector 20 or more than the half of H1.

The exposure light L2 which is incident from the upper surface 30a of the light transmission medium 30 propagates in the light transmission medium 30. Then, the exposure light L2 is reflected at an interface IF at a level higher than the upper surface of intermediate layer 40 and is then emitted from the upper surface 20a. Finally, the exposure light L2 reaches a wafer. Exposure light may propagate in both the light transmission medium 30 and the intermediate layer 40 to be reflected by an interface IF positioned at a level below that of the light transmission medium 30 and then propagates in the light reflector 20. A propagation distance, within the light reflector 20, of the exposure light which is reflected by the interface IF positioned at a level lower than the light transmission medium 30 is longer than the penetration length Lp. Accordingly, since being absorbed in the light reflector 20, such exposure light is not emitted as reflected light.

As described above, in reflection-type exposure mask 4, only the exposure light L2 reflected at the interface IF positioned at a level higher than the intermediate layer 40 interferes with the exposure light L1 (see FIG. 2A). Thus, it is possible to increase light intensity of the optical image formed on a wafer.

The reflection-type exposure mask 5 illustrated in FIG. 4B includes a light transmission medium 50 that covers the side surface of the light reflector 20. The light transmission medium 50 is provided so as not to cover the entirety of the exposed surface of the substrate 10. That is, the light transmission medium 50 covers the side surface of the light reflector 20 and a portion of substrate 10 directly adjacent to the light reflector 20.

The material used for the light transmission medium 50 may be zirconium, but any material maybe used so long as the material causes the phase difference between exposure light rays L1 and L2 to be reduced. For example, carbon, boron carbide, or the like may be used for the light transmission medium 50. It is preferable that the refractive index of the light transmission medium 50 has a value between the refractive index of the first refractive-index layer 23 and the refractive index of the second refractive-index layer 25, for example.

As illustrated in FIG. 4B, if a refraction angle of the exposure light L2 is set as θ, the width W2 of the light transmission medium 50 in a direction perpendicular to the side surface of the light reflector 20 is equal to or wider than penetration length Lp×tan θ, for example. Thus, it is possible to reduce the phase difference between exposure light L1 (see FIG. 2A) and the exposure light L2 and to improve light intensity of an optical image formed on a wafer. That is, exposure light which is incident from the side surface of the light transmission medium 50 and then reflected by the interface IF is absorbed in the light reflector 20. Accordingly, for example, it is possible to prevent an occurrence of emitting light having a phase which is different from that of the exposure light L1, from the light reflector 20 and to prevent the decrease of light intensity of an optical image.

In a process of forming the light transmission medium 50, for example, a zirconium layer that covers the surface of the substrate 10 and the light reflector 20 and has a conformal thickness corresponding to the width W2 of the light transmission medium 50 is deposited. Then, for example, the zirconium layer formed on the side surface of the light reflector 20 can be left and other portions formed on the upper surfaces of the substrate 10 and the light reflector 20 are selectively removed by using anisotropic reactive ion etching (RIE).

Second Embodiment

Figure 5A:
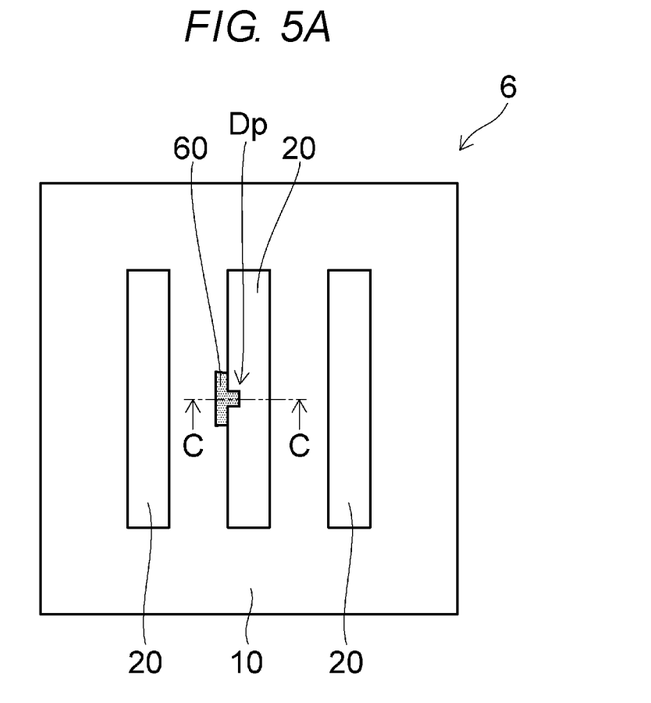
FIGS. 5A and 5B are schematic diagrams illustrating aspects of a reflection-type exposure mask according to a second embodiment.
Figure 5B:
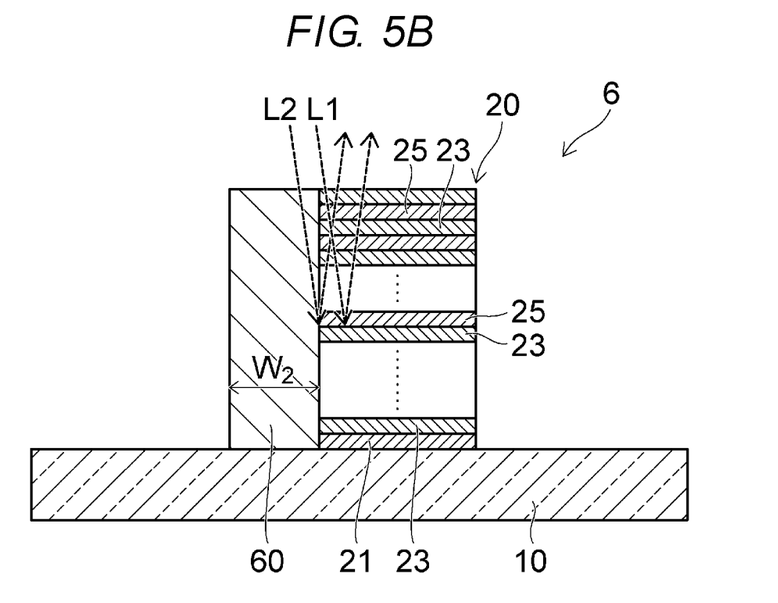

FIGS. 5A and 5B are schematic diagrams illustrating a reflection-type exposure mask 6 according to a second embodiment. FIG. 5A is a top view illustrating the reflection-type exposure mask 6. FIG. 5B is a schematic diagram illustrating a section taken along line C-C illustrated in FIG. 5A.

As illustrated in FIG. 5A, the reflection-type exposure mask 6 includes a substrate 10, a plurality of light reflectors 20, and a light transmission medium 60. The light reflectors 20 are provided on the substrate 10. The light transmission medium 60 is selectively provided on the side surface of the light reflector 20.

In this example, the light reflector 20 has a defective part Dp, also referred to as a defect, on the side surface thereof, and the light transmission medium 60 is formed to cover the defective part Dp. The light transmission medium 60 is formed by using electron beam (EB) deposition, for example. That is, the light transmission medium 60 is selectively deposited on the defective part Dp by irradiating the defective part Dp with an electron beam (EB) in an atmosphere including a gaseous raw material from which the light transmission medium 60 is formed.

As illustrated in FIG. 5B, the light reflector 20 includes first refractive-index layers 23 and second refractive-index layers 25 which are alternately stacked on the substrate. The light transmission medium 60 is provided on the side surface of the light reflector 20, and has a width W2 which is equal to or wider than penetration length Lp×tan θ, for example. The material used for the light transmission medium 60 is, for example, zirconium. However, any material may be used for the light transmission medium 60 so long as the material can cause the phase difference between the rays of exposure light L1 and L2 to be reduced. For example, carbon, boron carbide, or the like may be used. It is preferable that the refractive index of the light transmission medium 60 has a value between the refractive index of the first refractive-index layer 23 and the refractive index of the second refractive-index layer 25, for example.

Figure 6:
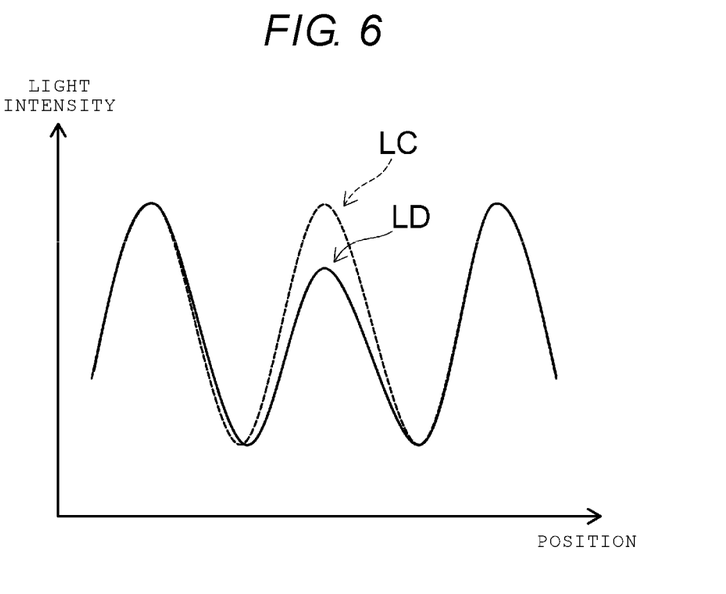
FIG. 6 is a schematic diagram illustrating characteristics of a reflection-type exposure mask according to the second embodiment.

FIG. 6 is a schematic diagram illustrating characteristics of the reflection-type exposure mask 6 according to the second embodiment. FIG. 6 is a schematic diagram illustrating light intensity distribution of light which is reflected onto a wafer from the portion taken along line C-C illustrated in FIG. 5A. In FIG. 6, light intensity distribution LC indicated by a broken line represents the characteristics of the reflection-type exposure mask 6. Light intensity distribution LD indicated by a solid line represents characteristics when the light transmission medium 60 is not provided.

As represented by the light intensity distribution LD, when the light transmission medium 60 is not provided, the reflectivity of the light reflector 20 having a defective part Dp is decreased. If the light transmission medium 60 is provided on the side surface of the light reflector 20, it is possible to prevent an occurrence of a phase difference between the exposure light L1 and the exposure light L2 and to improve the intensity of reflected light by interference. As a result, it is possible to compensate for the reflectivity decrease caused by the defective part Dp.

Figure 7A:
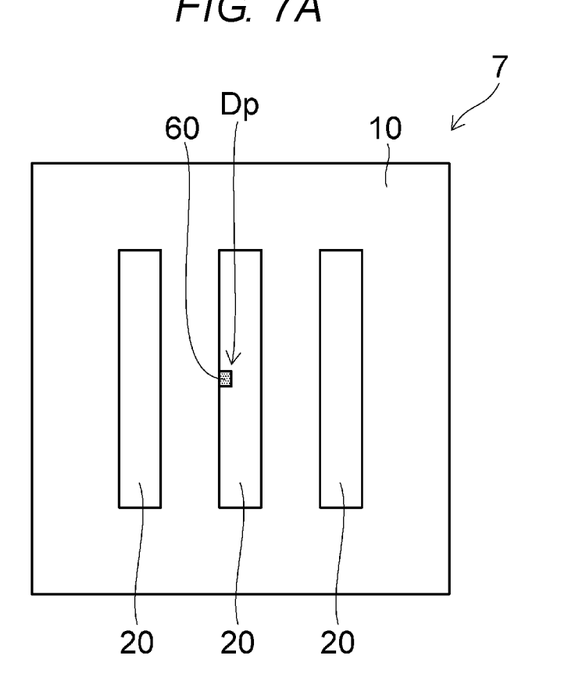
FIGS. 7A and 7B are schematic diagrams illustrating reflection-type exposure masks according to modification examples of the second embodiment.
Figure 7B:
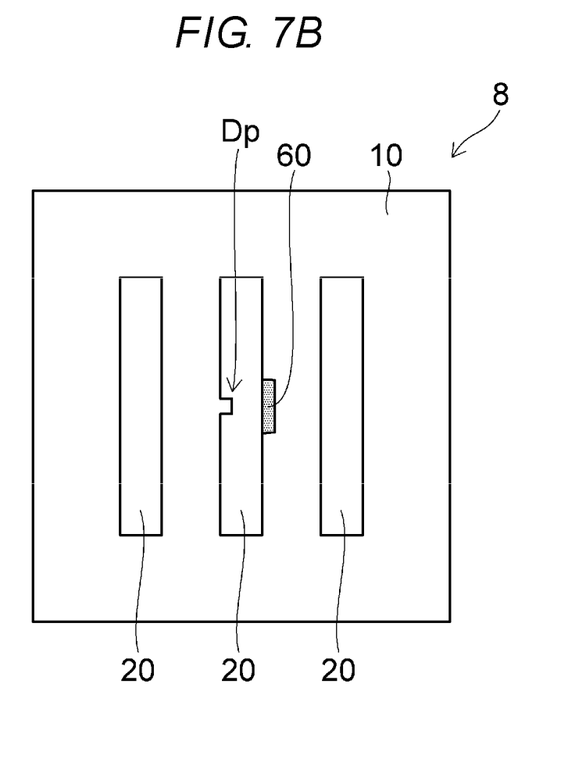

FIGS. 7A and 7B are schematic diagrams illustrating reflection-type exposure masks 7 and 8 according to modification examples of the second embodiment.

As illustrated in FIG. 7A, the light transmission medium 60 may be embedded within the defective part Dp. As illustrated in FIG. 7B, the light transmission medium 60 may be selectively formed on the side surface of the light reflector 20 opposite the defective part Dp. That is, if the reflectivity of the side opposite the defective part Dp is increased, it is possible in this manner to compensate for the decrease of light intensity due to the defective part Dp in an optical image formed on a wafer.

The light transmission medium 60 illustrated in FIG. 7B may be combined with the light transmission medium 60 illustrated in FIG. 5A or FIG. 7A. That is, the light transmission media 60 may also be provided on both side surfaces of the light reflector 20 at the same time. That is, the defective part Dp may be between the light transmission media 60 disposed on each side of the light reflector 20.

Figure 8:
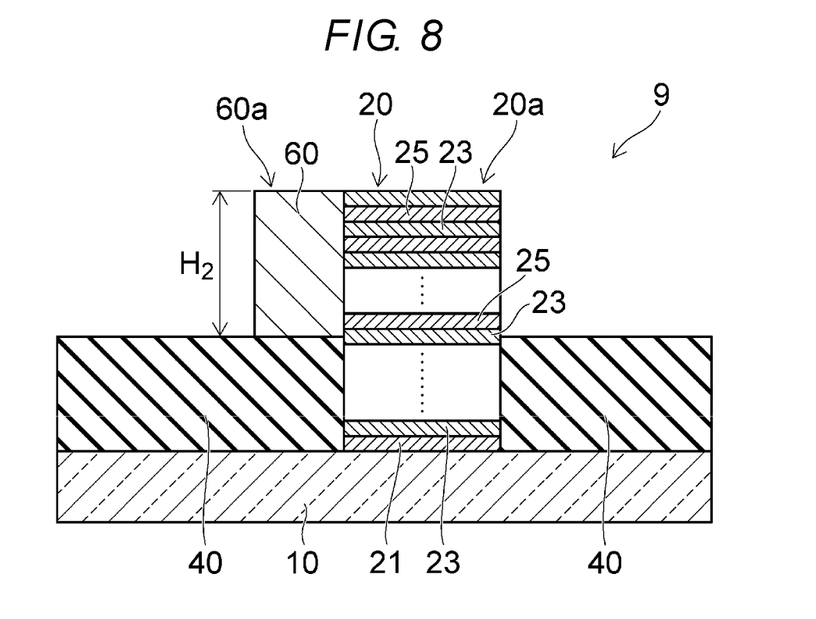
FIG. 8 is a cross-sectional view schematically illustrating a reflection-type exposure mask according to another modification example of the second embodiment.

FIG. 8 is a cross-sectional view schematically illustrating a reflection-type exposure mask 9 according to another modification example of the second embodiment. FIG. 8 is a schematic diagram illustrating a section which corresponds to the cross-section taken along line C-C in FIG. 5A.

The reflection-type exposure mask 9 illustrated in FIG. 8 includes an intermediate layer 40 that covers the upper surface of the substrate 10 and a lower portion of the side surface of the light reflector 20. The intermediate layer 40 is, for example, a silicon oxide layer provided to prevent collapse of the light reflector 20.

As illustrated in FIG. 8, the light transmission medium 60 is provided on the intermediate layer 40, so as to cover the defective part Dp (see FIG. 5A). The light transmission medium 60 has an upper surface 60a positioned at a level which is substantially the same level as the upper surface 20a. The light transmission medium 60 has a height H2 which is equal to or greater than the penetration length Lp of EUV light into the light reflector 20, for example. Thus, it is possible to reduce the phase difference between the rays of exposure light L1 and L2 (see FIG. 5B) and to compensate for the decrease in the reflectivity caused by the defective part Dp.

Figure 9A:
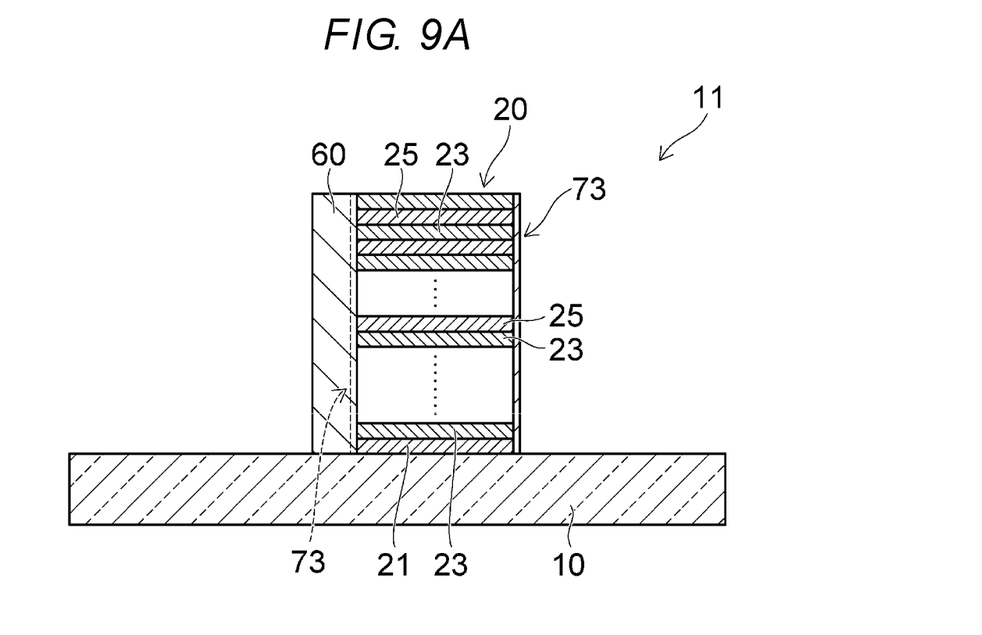
FIGS. 9A and 9B are cross-sectional views schematically illustrating a reflection-type exposure mask according to a still another modification example of the second embodiment.
Figure 9B:
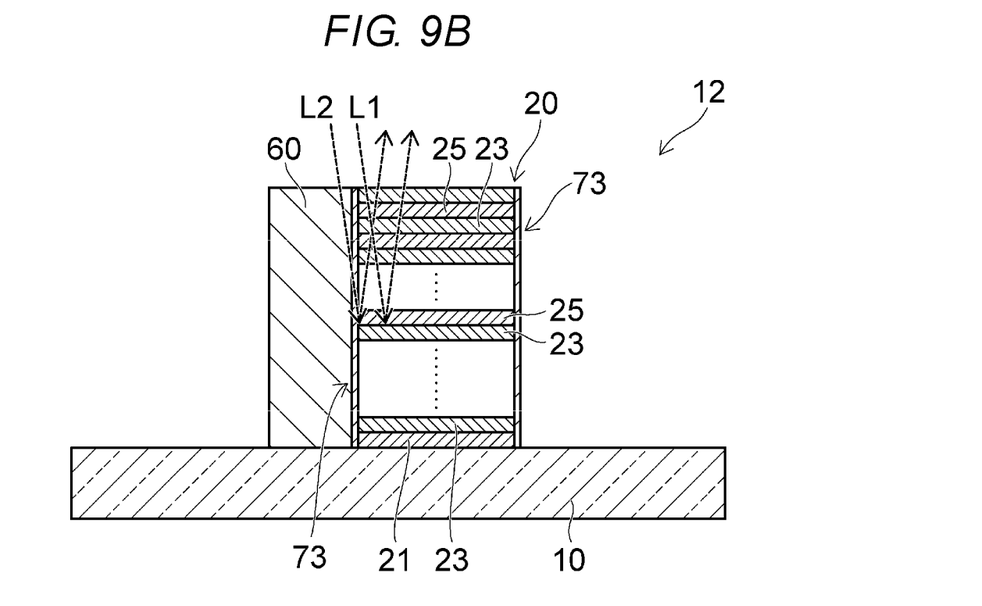

FIGS. 9A and 9B are cross-sectional views schematically illustrating reflection-type exposure masks 11 and 12 according to still other modification examples of the second embodiment. FIGS. 9A and 9B are schematic diagrams illustrating a section which corresponds to the cross-section taken along line C-C in FIG. 5A. FIG. 9A and 9B illustrate a case in which an external layer 73, such as a native oxide film, is formed on the side surface of the light reflector 20.

In the example illustrated in FIG. 9A, the external layer 73 is removed from one side of the light reflector 20 before the light transmission medium 60 is formed thereon. The external layer 73 is removed, for example, by EB assisted etching. That is, the external layer 73 is selectively removed by irradiating the external layer 73 with an electron beam in an atmosphere including an etching gas. The material used for the light transmission medium 60 is, for example, zirconium. However, any material may be used for the light transmission medium 60 so long as the material can cause the phase difference between the rays of exposure light L1 and L2 to be reduced. For example, carbon, boron carbide, or the like may be used.

As illustrated in FIG. 9B, the light transmission medium 60 may be also provided on the external layer 73 on the side surface of the light reflector 20. In this case, the exposure light L2 propagates through both the light transmission medium 60 and the external layer 73, and then is reflected by the interface IF. Accordingly, the light transmission medium 60 is selected such that the phase of the exposure light L2 which passes through a propagation path including the external layer 73 coincides with the phase of the exposure light L1 or the phase difference between the exposure light L2 and the exposure light L1 is reduced. The light transmission medium 60 includes chromium nitride, for example.

As described above, when the light reflector 20 has the defective part Dp, correction (compensation in reflectivity) is possible by including light transmission medium 60 as discussed above. In general, compensation for defects in reflectively is not otherwise possible by existing techniques. Also, the compensation of light intensity by use of the light transmission medium 60 is not limited to cases resulting from inclusion a of physical defective, such as defective part Dp, in the light reflector 20 and can be also applied to a case where reflectivity is locally decreased by another defect, so as defects in material(s).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reflection-type exposure mask, comprising:
 a plurality of light reflectors in a pattern on a substrate, the light reflectors each being adjacent to a space and having a multilayer structure including first-type layers and second-type layers that are alternately stacked, the second-type layers having a refractive index higher at an extreme ultraviolet wavelength than a refractive index of the first-type layer at the extreme ultraviolet wavelength, at least one of the light reflectors having a localized defect at a first position in the pattern; and
 a light transmitting medium selectively provided on the substrate adjacent to the at least one light reflector corresponding to the first position, the light transmitting medium contacting a first portion of a side surface of the at least one light reflector, a second portion of the side surface of the at least one light reflector being exposed to the space, wherein an attenuation coefficient of the light transmitting medium at the extreme ultraviolet wavelength is less than or equal to 0.043.

2. The reflection-type exposure mask according to claim 1, wherein a thickness, in a first direction perpendicular to the side surface, of the light transmitting medium is greater than a value obtained by multiplying the tangent of a refraction angle in the light transmitting medium for exposure light at the extreme ultraviolet wavelength incident on the substrate by a penetration depth of the exposure light into the light transmitting medium along a second direction perpendicular to the first direction.

3. The reflection-type exposure mask according to claim 2, further comprising:
 an intermediate layer between the light transmitting medium and the substrate in the second direction, wherein
 a thickness of the light transmitting medium in the second direction is greater than a penetration depth of the exposure light within the light reflector along the second direction.

4. The reflection-type exposure mask according to claim 1, further comprising:
 an intermediate layer between the light transmitting medium and the substrate, wherein
 a thickness of the light transmitting medium in a direction orthogonal to the substrate is greater than a penetration depth of an exposure light within the light reflector along the direction, the exposure light being at the extreme ultraviolet wavelength.

5. The reflection-type exposure mask according to claim 1, wherein the first portion of the side surface is on a same side of the at least one light reflector as the localized defect.

6. The reflection-type exposure mask according to claim 1, wherein the first portion of the side surface is on a side of the at least one reflector opposite the localized defect.

7. The reflection-type exposure mask according to claim 1, wherein
 the first-type layers are molybdenum,
 the second-type layers are silicon, and
 the light transmitting layer includes zirconium.

8. The reflection-type exposure mask according to claim 1, wherein the multilayer structure further includes:
 a buffer layer between the substrate and the alternately stacked first-type and second-type layers; and
 a capping layer on an uppermost one of the alternately stacked first-type and second-type layers.

9. The reflection-type exposure mask according to claim 1, wherein the substrate is a glass substrate.

10. The reflection-type exposure mask according to claim 1, wherein the light-transmitting medium is one of carbon, carbon boride, and zirconium.

11. The reflection-type exposure mask according to claim 1, further comprising:
 an intermediate layer between the light transmitting medium and the substrate, wherein
 a thickness of the light transmitting medium in a direction orthogonal to the substrate is greater than a penetration depth of an exposure light within the light reflector along the direction, the exposure light being at the extreme ultraviolet wavelength and a six degree angle of incidence.

12. The reflection-type exposure mask according to claim 1, wherein the light transmitting medium is not provided at any position in the pattern other than the first position.

13. The reflection-type exposure mask according to claim 1, wherein the light transmitting medium has a side surface exposed to the space, and the side surface of the light transmitting medium is between two adjacent light reflectors in the plurality of light reflectors in the pattern on the substrate.

14. The reflection-type exposure mask according to claim 1, wherein a surface of the substrate is exposed to the space.

15. The reflection-type exposure mask according to claim 1, wherein the side surface of the at least one light reflector transmit light at the extreme ultraviolet wavelength.

16. The reflection-type exposure mask according to claim 1, wherein the plurality of light reflectors contacts the substrate.

17. A method of fabricating a reflection-type exposure mask for extreme ultraviolet wavelengths, the method comprising:
 forming a plurality of light reflectors in a pattern on a substrate, the light reflectors each being adjacent to a space and having a multilayer structure including first-type layers and second-type layers that are alternately stacked, the second-type layers having a refractive index higher at an extreme ultraviolet wavelength than a refractive index of the first-type layer at the extreme ultraviolet wavelength;
 determining a position of a localized defect in at least one of the light reflectors;
 selectively forming a light transmitting medium on the substrate at a first position corresponding to the position of the localized defect and adjacent to the at least one light reflector, the light transmitting medium contacting a first portion of a side surface of the at least one light reflector, a second portion of the side surface of the at least one light reflector that being left exposed to the space, wherein an attenuation coefficient of the light-transmitting medium at the extreme ultraviolet wave length is less than or equal to 0.043.

18. The method according to claim 17, further comprising:
 forming an intermediate layer on the substrate before forming the light transmitting medium such that the intermediate layer is disposed between the light transmitting medium and the substrate in a direction orthogonal to the substrate.

19. The method according to claim 17, wherein the first portion of the side surface is on a side of the at least one light reflector opposite the localized defect.

20. The method according to claim 17, wherein the first portion of the side surface is on a same side of the at least one light reflector as the localized defect.

21. A method of photolithographic patterning, comprising:
- exposing a reflection-type exposure mask to light at an extreme ultraviolet wavelength; and
- focusing the light reflected from the reflection-type exposure mask on to a first substrate coated with a photosensitive resist film, wherein the reflection-type exposure mask comprises:
  - a plurality of light reflectors in a pattern on a second substrate, the light reflectors each being adjacent to a space and having a multilayer structure including first-type layers and second-type layers that are alternately stacked, the second-type layers having a refractive index higher at an extreme ultraviolet wavelength than a refractive index of the first-type layer at the extreme ultraviolet wavelength, at least one of the light reflectors having a localized defect at a first position in the pattern; and
  - a light transmitting medium selectively provided on the substrate adjacent to the at least one light reflector corresponding to the first position, the light transmitting medium contacting a side surface of the at least one light reflector, a second portion of the side surface of the at least one light reflector being exposed to the space, wherein an attenuation coefficient of the light-transmitting medium at the extreme ultraviolet wavelength is less than or equal to 0.043.

* * * * *